United States Patent
Skotnicki et al.

(10) Patent No.: US 6,713,356 B1
(45) Date of Patent: Mar. 30, 2004

(54) METHOD FOR MAKING A SEMICONDUCTOR DEVICE COMPRISING A STACK ALTERNATELY CONSISTING OF SILICON LAYERS AND DIELECTRIC MATERIAL LAYERS

(75) Inventors: Thomas Skotnicki, Crolles (FR); Malgorzata Jurczak, Grenoble (FR)

(73) Assignee: France Télécom, Paris (FR)

( * ) Notice: Subject to any disclaimer, the term of this patent is extended or adjusted under 35 U.S.C. 154(b) by 0 days.

(21) Appl. No.: 10/019,169

(22) PCT Filed: Jun. 28, 2000

(86) PCT No.: PCT/FR00/01798

§ 371 (c)(1),
(2), (4) Date: Apr. 23, 2002

(87) PCT Pub. No.: WO01/01496

PCT Pub. Date: Jan. 4, 2001

(30) Foreign Application Priority Data

Jun. 28, 1999 (FR) ............................................. 99 08249

(51) Int. Cl.$^7$ ............................................. H03L 21/336
(52) U.S. Cl. ..................... 438/285; 438/157; 438/424; 438/738
(58) Field of Search ................................ 438/285, 157, 438/424, 738

(56) References Cited

U.S. PATENT DOCUMENTS 6,495,403 B1 * 12/2002 Skotnicki et al. ............ 438/157
6,537,894 B2 * 3/2003 Skotnicki et al. ............ 438/424
6,555,482 B2 * 4/2003 Skotnicki et al. ............ 438/738

FOREIGN PATENT DOCUMENTS

| EP | 0 539 685 | 5/1993 |
| WO | 96/15550 | 5/1996 |
| WO | 97/23000 | 6/1997 |

OTHER PUBLICATIONS

M. Jurczak et al: "SON (Silicon On Nothing)–A New Device Architecture for the ULSI Era" 1999 Symposium on VLSI Technology Digest of Technical Papers (IEEE CAT. No. 99CH36325), Proceedings from the 1999 Symposium on VLSI Technology, Kyoto, Japan, Jun. 14–16, 1999, pp. 29–30, XP002133376, 1999, Tokyo, Japan, Japan Soc. Appl. Phys, Japan ISBN: 4–930813–93–X.

\* cited by examiner

*Primary Examiner*—Van Thu Nguyen
*Assistant Examiner*—Michael K. Luhrs
(74) *Attorney, Agent, or Firm*—Meyertons, Hood, Kivlin, Kowert & Goetzel, P.C.; Eric B. Meyertons

(57) ABSTRACT

A method of fabricating a semiconductor device consisting of a silicon substrate on which is formed a stack of layers is described. The stack may have successively at least one first and one second combination. Each combination may consist, with reference to the substrate, of a thin bottom SiGe layer and a thin top silicon layer. A thin silicon dioxide film (18) is formed on the thin top silicon layer of the second combination so that the layer concerned supports the layers of the stack on at least two opposite lateral sides of the stack. Successive selective lateral etching of the SiGe layers is then carried out to form tunnels which are filled with a dielectric material.

11 Claims, 4 Drawing Sheets

METHOD FOR MAKING A SEMICONDUCTOR DEVICE COMPRISING A STACK ALTERNATELY CONSISTING OF SILICON LAYERS AND DIELECTRIC MATERIAL LAYERS

BACKGROUND OF THE INVENTION

1. Field of the Invention

The present invention relates to a method of fabricating a semiconductor device comprising a stack of silicon layers alternating with dielectric material layers. It has a particularly beneficial application in applications such as ultimate CMOS, the integration of logic functions into a single structure, memories, gate all around (GAA) transistors, sensors, etc.

2. Description of the Related Art

One limiting factor of a standard massive architecture MOSFET is the substrate effect which degrades the performance of the transistor. This drawback is avoided in a silicon on insulator (SOI) architecture MOSFET by separating the thin film of silicon from the substrate by means of a buried layer of silicon oxide.

Eliminating the substrate effect in a totally depleted thin-film SOI architecture MOSFET increases the drain current.

However, an ultrathin SOI architecture MOSFET has a high source/drain (S/D) resistance because of shallow junctions limited by the thickness of the silicon layer and poor thermal conductivity. The cost of fabricating SOI architecture substrates is also high, which has restricted their entry onto the market.

Silicon on nothing (SON) architecture transistors combining the advantages of the massive and silicon on insulation (SOI) architectures can eliminate the above disadvantages. FIG. 1 shows an SON architecture transistor comprising a silicon substrate 1 having a top surface coated with a thin gate dielectric layer 4 and in which source and drain regions 5 and 6, which define a channel region 1a between them, and a gate 7 on the top surface of the body above the channel region 1a are formed. The channel region 1a of the transistor between the source and drain regions 5 and 6 further includes a continuous insulative cavity 2 delimiting, in conjunction with the drain and source regions 5 and 6, a thin layer 3 of silicon on top of the insulative cavity 2. The gate 7 has spacers 8 and 9 on either side. Contacts 10, 11 are provided in the source and drain regions 5, 6.

A method of producing a basic semiconductor device, from which the transistor described above can be made, may be desirable.

A method of making ultimate CMOS integrating logic functions into a single structure, memories, gate all around (GAA) transistors, sensors, etc, in which the substrate effect is eliminated or at least reduced without increasing the series resistance of the source and drain regions may also be desirable. The method may offer improved heat dissipation over SOI architecture devices and have fabrication costs lower than those of the SOI architecture.

SUMMARY OF THE INVENTION

In an embodiment, a method of fabricating a semiconductor device includes the following steps:
a) forming on a main surface of a silicon substrate, a stack having successively at least one first combination and one second combination. Each combination having, with reference to the substrate, a thin bottom layer of germanium, or a germanium and silicon alloy (SiGe), and a thin top layer of silicon;
b) forming on the thin top silicon layer of the second combination, a thin silicon dioxide layer that supports the layers of the stack on at least two opposite lateral sides of the stack;
c) forming a hard mask on the thin silicon dioxide layer so as to form two separate opposed areas on respective opposite sides of two opposite edges of the hard mask;
d) etching the thin silicon dioxide layer, the top silicon layer, and at least part of the lower germanium or SiGe layer of the second combination in the two separate opposed areas;
e) selectively laterally etching the bottom germanium or SiGe layer of the second combination to form a tunnel;
f) filling the tunnel of the second combination with a solid dielectric material;
g) etching the top silicon layer and at least part of the bottom germanium or SiGe layer of the first combination in the two separate opposed areas;
h) selectively laterally etching the bottom germanium or SiGe layer of the first combination to form a tunnel; and
i) optionally filling the tunnel of the first combination with a solid dielectric material.

The germanium and silicon alloys (SiGe) may include alloys with the formulas $Si_{1-x}Ge_x$ ($0<x\leq1$) and $Si_{1-x-y}Ge_xC_y$ ($0<x\leq0.95$; $0<y\leq0.05$).

The hard mask can be made from any conventional material, which can be selectively etched relative to silicon, germanium, and/or SiGe.

The etching of the separate opposed areas of steps d) and g) may include plasma etching, which is well known in the art.

The etching of the germanium or SiGe layers of steps e) and h) is either anisotropic plasma etching, which is selective relative to silicon and the dielectric material, or selective chemical etching using an oxidizing solution, which is well known in the art. The tunnels formed in this way, in place of the germanium or SiGe layers, are filled with a solid dielectric material during steps f) and i). For example, the tunnels are filled with silicon dioxide ($SiO_2$) or $Ta_2O_5$. In particular, they can be filled with $SiO_2$ by thermal oxidation. Nevertheless, the tunnel of the first combination need not be filled with a solid dielectric material, in which case air is used as the dielectric material for that tunnel, without compromising the physical integrity of the semiconductor device obtained.

In an embodiment, a semiconductor device includes a silicon body on part of which is formed a stack of successive layers of dielectric material and silicon.

In an embodiment, the dielectric material layer of the stack immediately adjacent the silicon body is a layer of air. The upper layers may be supported by the final silicon dioxide layer extending beyond the stack on two opposite lateral sides.

BRIEF DESCRIPTION OF THE DRAWINGS

Other advantages and features of the invention will become apparent after reading the following detailed description of one non-limiting embodiment of the invention and examining the accompanying drawings, in which.

DETAILED DESCRIPTION OF THE PREFERRED EMBODIMENTS

A method of fabricating a two-level semiconductor device is described, although the invention is not limited to a two-level device. In an embodiment, the method can easily be applied to semiconductor devices with more than two levels.

Figure 1:
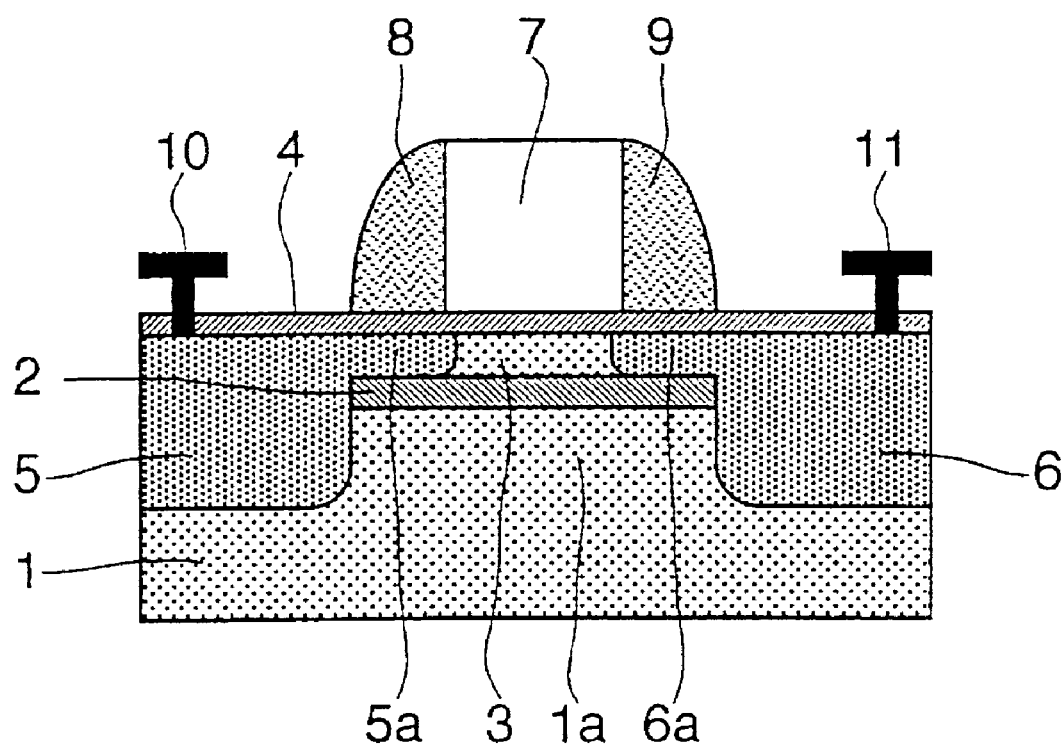
FIG. 1 shows a prior art SON architecture transistor.
Figure 2A:
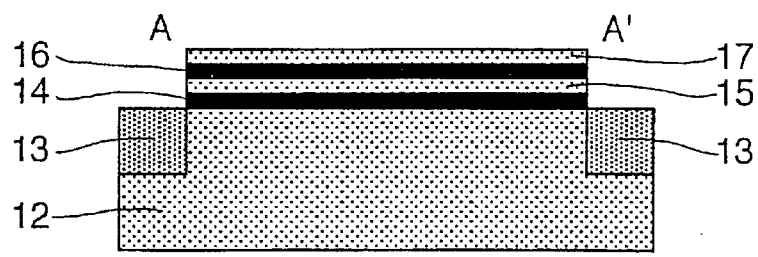
FIGS. 2a to 2h depict lateral sections showing the various steps of a fabrication process.

FIG. 2a shows a silicon substrate 12 whose upper part is surrounded by a rectangular section cylindrical insulative box 13. On the upper surface of the silicon substrate 12 delimited by the insulative box 13, a first combination is formed consisting of a bottom layer 14 of silicon and germanium alloy (SiGe) and a top layer 15 of silicon. There is then formed, on top of the first combination, a second combination also made up of a bottom layer 16 of SiGe and a top layer 17 of silicon.

The silicon layers 15, 17 and the SiGe layers 14, 16 of the two combinations are formed by selective epitaxial growth. This ensures continuity of the lattice of the substrate from the silicon substrate 12 to the consecutive silicon layers 15, 17 and SiGe layers 14, 16. The stack formed in this way covers all of the top surface of the silicon substrate 12.

Figure 2B:
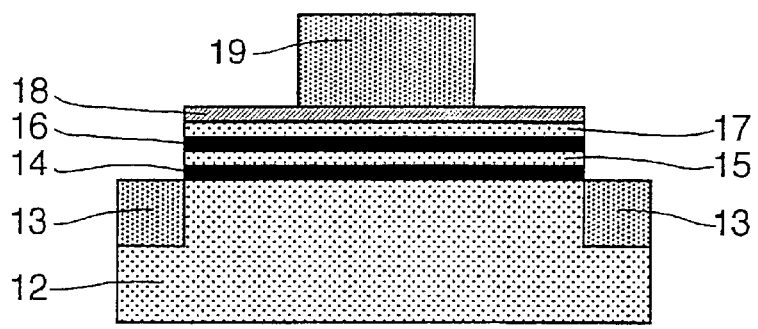

As shown in FIG. 2a, the next step consists firstly of growing a thin silicon dioxide layer 18 (as depicted in FIG. 2b) onto the top silicon layer 17 of the second combination. The thin silicon dioxide layer 18 does not cover the insulative box 13 on two main lateral sides A and A' of the stack consisting of the layers 14, 15, 16 and 17. On the other hand, the thin silicon dioxide layer 18 extends over the insulative box 13 along the two secondary lateral sides of the stack. In FIGS. 2a to 2h, the two secondary lateral sides are perpendicular to the two main lateral sides A and A', i.e., perpendicular to the section plane.

Then, as shown in FIG. 2b, a hard mask 19 is formed on a central part of the thin silicon dioxide layer 18. It also extends over the two secondary lateral sides of the stack. The hard mask 19 can be made from any type of material enabling selective etching relative to silicon and the SiGe alloy. In the case of fabricating an MOS transistor, for example, the hard mask 19 can be replaced by a polysilicon grid covered with a thin layer of the hard mask. That material can be a layer of silicon oxynitride, for example, as is well known in the art.

Figure 2C:
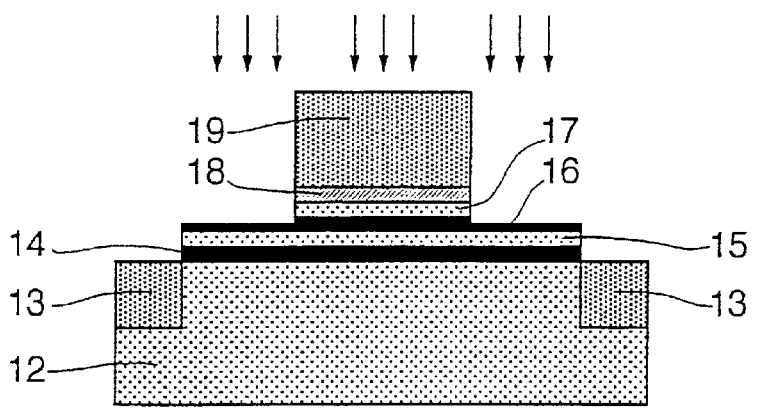

The silicon dioxide layer 18, the top silicon layer 17 of the second combination, and an upper part of the bottom SiGe layer 16 of the second combination are then etched on the two main lateral sides A and A', as shown in FIG. 2c. For example, they may be etched by means of a plasma. The silicon dioxide layer 18 and the top silicon layer 17 of the second combination are etched. Only the parts under the hard mask 19 remain.

Figure 2D:
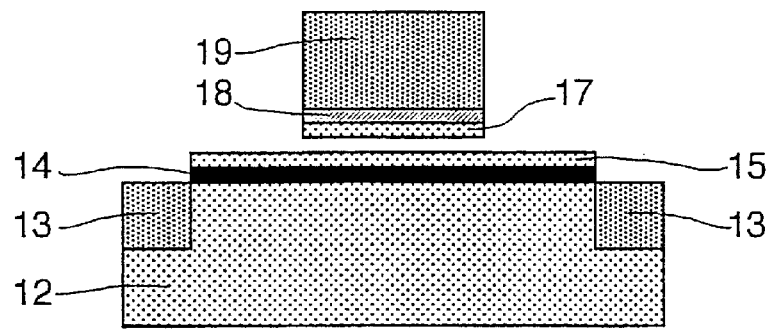
Figure 2E:
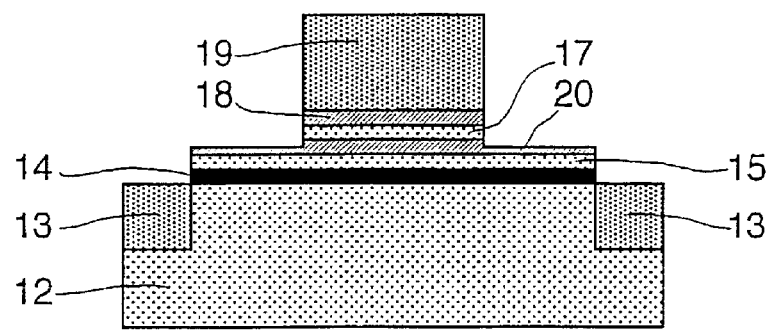

The next step is to eliminate the bottom SiGe layer 16 by means of plasma etching, which creates a tunnel delimited at the top by the top silicon layer 17 of the second combination and at the bottom by the top silicon layer 15 of the first combination. It is also possible to use selective chemical etching of the SiGe layer. For example, it is possible to use selective chemical etching using a standard oxidizing solution. The top silicon layer 17 of the second combination does not collapse onto the top silicon layer 15 of the first combination because it is supported by the silicon dioxide layer 18 and the hard mask 19, which extend over the portions of the insulative box 13 on the two secondary lateral sides. FIG. 2d shows the tunnel formed between the silicon layers 15 and 17.

This first tunnel is then filled with a dielectric 20, such as silicon dioxide, by thermal oxidation.

Figure 2F:
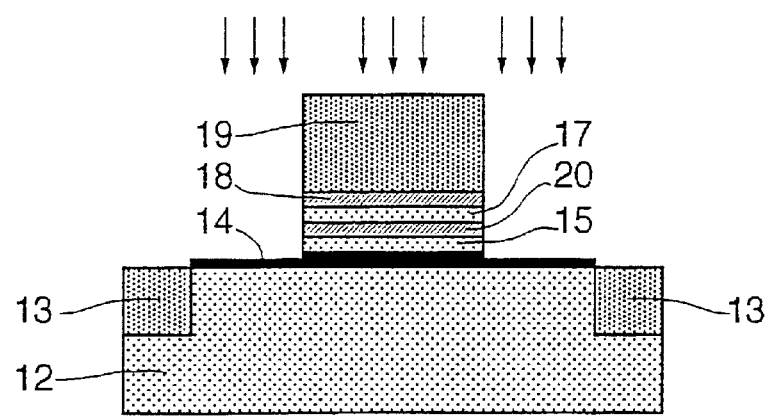

A further etching operation is then carried out on two opposite lateral sides of the hard mask to eliminate the silicon dioxide 20 used to fill the first tunnel, when present, the top silicon layer 15 of the first combination, and an upper part of the bottom SiGe layer 14 of the first combination (see FIG. 2f).

Figure 2G:
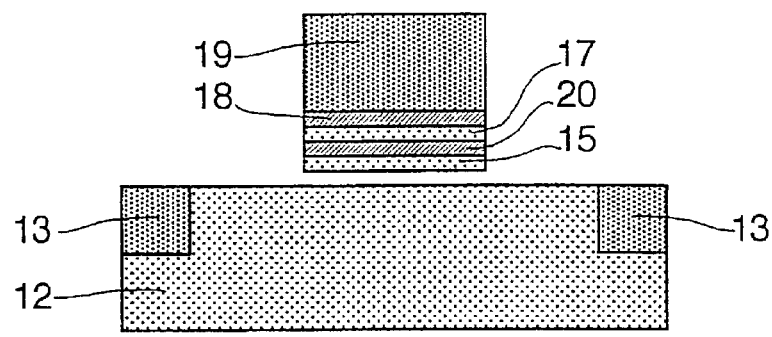

Further plasma etching eliminates the bottom SiGe layer 14 of the first combination. This creates a second tunnel, as shown in FIG. 2g. The layers above the tunnel are then supported by the silicon dioxide layer 18 and the hard mask 19 on the two secondary lateral sides bearing on two lateral portions of the insulative box 13.

Figure 2H:
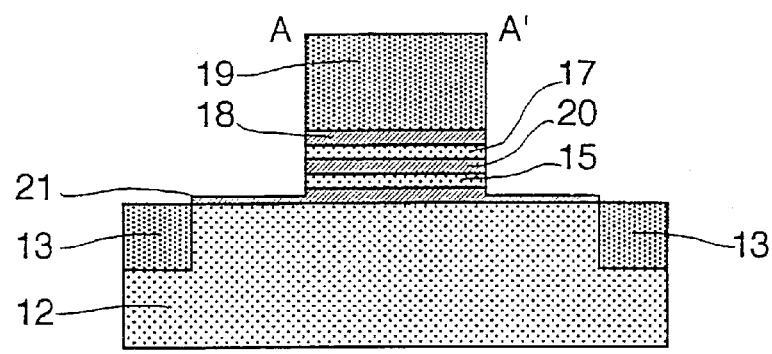

FIG. 2h shows an optional final step of filling the second tunnel with silicon dioxide 21 by thermal oxidation. FIG. 2h therefore shows the finished semiconductor device.

Figure 3:
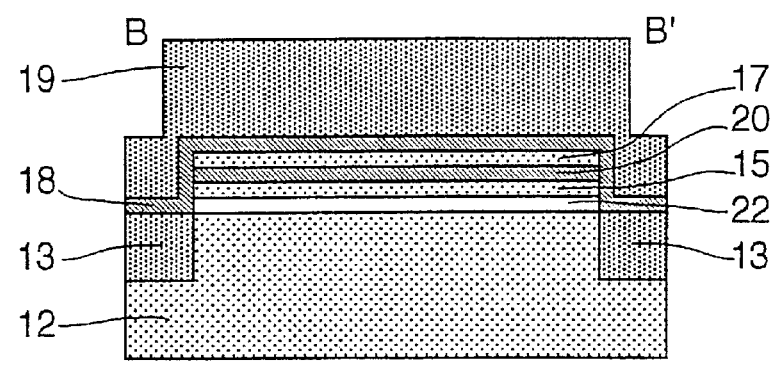
FIG. 3 illustrates a view of one embodiment of a semiconductor device in section taken on a section plane perpendicular to the section plane of FIGS. 2a to 2h.

In an embodiment, it is possible to omit the last step of filling the tunnel with a dielectric material (silicon dioxide 21). A device would then be obtained having a layer of air 22 between the top silicon layer 15 of the first combination and the silicon substrate 12. FIG. 3 shows a device of this kind in section on a plane perpendicular to the section plane of the preceding figures. The silicon dioxide layer 18 and the hard mask 19 supporting the silicon layer 17, the SiGe layer 16, and the silicon layer 15 along the two secondary lateral sides (B and B' in FIG. 3), bearing on two lateral portions of the insulative box 13, can be seen.

The semiconductor device as described includes a plurality of layers stacked on the top surface of a silicon substrate and can advantageously be used as a basic device for fabricating new semiconductor components.

What is claimed is:

1. A method of fabricating a semiconductor device, the method comprising:

forming on a main surface of a silicon substrate, a stack comprising successively at least one first combination and one second combination, wherein each combination comprises, with reference to the substrate, a thin bottom layer of germanium, or a germanium and silicon alloy (SiGe), and a thin top layer of silicon;

forming on the thin top silicon layer of the second combination, a thin silicon dioxide layer that supports the layers of the stack on at least two opposite lateral sides of the stack;

forming a hard mask on the thin silicon dioxide layer so as to form two separate opposed areas on respective opposite sides of two opposite edges of the hard mask;

etching the thin silicon dioxide layer, the top silicon layer and at least part of the lower germanium or SiGe layer of the second combination in the two separate opposed areas;

selectively laterally etching the bottom germanium or SiGe layer of the second combination to form a tunnel;

thermally oxidizing the tunnel of the second combination;

etching the top silicon layer and at least part of the bottom germanium or SiGe layer of the first combination in the two separate opposed areas; and selectively laterally etching the bottom germanium or SiGe layer of the first combination to form a tunnel.

2. The method of claim 1, wherein the germanium and silicon SiGe alloy comprises an alloy formed of germanium and silicon such that $Si_{1-x}Ge_x$ (0<x≦1) and $Si_{1-x-y}Ge_xC_y$ (0<x≦0.95; 0<y≦0.05).

3. The method of claim 1, wherein the hard mask comprises a material which can be selectively etched relative to silicon, germanium, and/or SiGe.

4. The method of claim 1, wherein etching of the separate opposed areas comprises plasma etching.

5. The method of claim 1, wherein etching of the germanium or SiGe layers comprises either anisotropic plasma etching, which is selective relative to silicon and the oxidized silicon, or selective chemical etching using an oxidizing solution.

6. The method of claim 1, further comprising thermally oxidizing the tunnel of the first combination.

7. The method of claim 1, wherein forming the hard mask comprises forming a polysilicon grid on the thin silicon dioxide layer and covering the polysilicon grid with a thin layer hard mask.

8. The method of claim 1, further comprising fabricating a CMOS device.

9. A method of fabricating a semiconductor device, the method comprising:
    forming on a main surface of a silicon substrate, a stack comprising successively at least one first combination and one second combination, wherein each combination comprises, with reference to the substrate, a thin bottom layer of germanium, or a germanium and silicon alloy (SiGe), and a thin top layer of silicon;
    forming on the thin top silicon layer of the second combination, a thin silicon dioxide layer that supports the layers of the stack on at least two opposite lateral sides of the stack;
    forming a hard mask on the thin silicon dioxide layer so as to form two separate opposed areas on respective opposite sides of two opposite edges of the hard mask;
    etching the thin silicon dioxide layer, the top silicon layer and at least part of the lower germanium or SiGe layer of the second combination in the two separate opposed areas;
    selectively laterally etching the bottom germanium or SiGe layer of the second combination to form a tunnel;
    thermally oxidizing the tunnel of the second combination;
    etching the top silicon layer and at least part of the bottom germanium or SiGe layer of the first combination in the two separate opposed areas;
    selectively laterally etching the bottom germanium or SiGe layer of the first combination to form a tunnel; and
    filling the tunnel of the first combination with a solid dielectric material.

10. The method of claim 9, wherein the germanium and silicon SiGe alloy comprises an alloy formed of germanium and silicon such that $Si_{1-x}Ge_x$ (0<x≦1) and $Si_{1-x}yGe_y$ (0<x≦0.95; 0<y≦0.05).

11. The method of claim 9, wherein forming the hard mask comprises forming a polysilicon grid on the thin silicon dioxide layer and covering the polysilicon grid with a thin layer hard mask.

* * * * *

UNITED STATES PATENT AND TRADEMARK OFFICE
CERTIFICATE OF CORRECTION

PATENT NO. : 6,713,356 B1
DATED : March 30, 2001
INVENTOR(S) : Skotnicki et al.

It is certified that error appears in the above-identified patent and that said Letters Patent is hereby corrected as shown below:

Column 6,
Line 23, please delete "$Si_{1-x}yGe_y$" and substitute therefor -- $Si_{1-x-y}Ge_xC_y$ --

Signed and Sealed this

Twenty-ninth Day of June, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,713,356 B1
DATED : March 30, 2004
INVENTOR(S) : Skotnicki et al.

It is certified that error appears in the above-identified patent and that said Letters Patent is hereby corrected as shown below:

Column 6,
Line 23, please delete "$Si_{1-x}yGe_y$" and substitute therefor -- $Si_{1-x-y}Ge_xC_y$ --

This certificate supersedes Certificate of Correction issued June 29, 2004.

Signed and Sealed this

Fifth Day of October, 2004

JON W. DUDAS
*Director of the United States Patent and Trademark Office*